United States Patent
Yu

(10) Patent No.: US 11,081,537 B2
(45) Date of Patent: Aug. 3, 2021

(54) SUBSTRATE AND MANUFACTURING METHOD THEREOF

(71) Applicant: TCL China Star Optoelectronics Technology Co., Ltd., Guangdong (CN)

(72) Inventor: Yun Yu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 26 days.

(21) Appl. No.: 16/618,992

(22) PCT Filed: Nov. 15, 2019

(86) PCT No.: PCT/CN2019/118995
§ 371 (c)(1),
(2) Date: Dec. 3, 2019

(87) PCT Pub. No.: WO2021/027168
PCT Pub. Date: Feb. 18, 2021

(65) Prior Publication Data
US 2021/0050401 A1 Feb. 18, 2021

(30) Foreign Application Priority Data
Aug. 15, 2019 (CN) .......................... 201910753306.7

(51) Int. Cl.
*H01L 27/32* (2006.01)
*G02F 1/1362* (2006.01)
*H01L 27/12* (2006.01)

(52) U.S. Cl.
CPC .... *H01L 27/3272* (2013.01); *G02F 1/136209* (2013.01); *G02F 1/136277* (2013.01);
(Continued)

(58) Field of Classification Search
CPC . H01L 27/3272; H01L 27/124; H01L 27/127; H01L 27/3246; G02F 1/136209; G02F 1/136277
(Continued)

(56) References Cited

U.S. PATENT DOCUMENTS

2007/0076146 A1 4/2007 Harada et al.
2009/0289260 A1 11/2009 Sonoda et al.
(Continued)

FOREIGN PATENT DOCUMENTS

| CN | 101344607 A | 1/2009 |
| CN | 101499414 A | 8/2009 |

(Continued)

*Primary Examiner* — Thinh T Nguyen

(57) ABSTRACT

The present invention provides a substrate and a manufacturing method of the substrate. The substrate includes: a glass base plate; a first base layer on the glass base plate; a light shielding layer on the first base layer; multiple pixel units placed on the first base layer, the pixel units including at least one light transmissive region; and a photomask for exposing the light shielding layer. The photomask is used to expose, develop, and etch away a portion of the light shielding layer on the pixel units which need to communicate with each other, so that multiple grooves are formed in the light shielding layer to make the pixel units communicate with each other.

10 Claims, 6 Drawing Sheets

(52) U.S. Cl.
CPC .......... *H01L 27/124* (2013.01); *H01L 27/127* (2013.01); *H01L 27/3246* (2013.01)

(58) Field of Classification Search
USPC ......... 257/88, 98, 72, 59; 438/22, 24, 46, 47
See application file for complete search history.

(56) References Cited

U.S. PATENT DOCUMENTS

| | | |
|---|---|---|
| 2016/0380009 A1 | 12/2016 | Deng |
| 2019/0013409 A1* | 1/2019 | Li et al. ............ H01L 29/76875 |
| 2019/0094638 A1 | 3/2019 | Li et al. |
| 2020/0243621 A1 | 7/2020 | Zhao |

FOREIGN PATENT DOCUMENTS

| | | |
|---|---|---|
| CN | 101561602 A | 10/2009 |
| CN | 103809329 A | 5/2014 |
| CN | 104934446 A | 9/2015 |
| CN | 105044989 A | 11/2015 |
| CN | 105974651 A | 9/2016 |
| CN | 205844676 U | 12/2016 |
| CN | 107422543 A | 12/2017 |
| CN | 107479292 A | 12/2017 |
| CN | 107895736 A | 4/2018 |
| CN | 109860438 A | 6/2019 |

* cited by examiner

SUBSTRATE AND MANUFACTURING METHOD THEREOF

1. FIELD OF DISCLOSURE

The present invention relates to a field of display devices and in particular to a substrate and a manufacturing method thereof.

2. DESCRIPTION OF RELATED ART

Due to the features of being thin, flexible, non-fragile, and inexpensive, flexible display technology has been extensively used in various electronic products, which has made flexible display technology an important development trend in the field of display devices. At present, the flexible display technology is mainly focused on flexible organic light-emitting diodes (OLEDs), flexible liquid crystal displays (LCDs), and etc., and materials and manufacturing processes involved in flexible substrates/covers are the key to developing these products. Polyimide (PI) is typically used as material of the flexible substrates in conventional techniques due to stable chemical resistance, good resistance against radiation, being heat resistant, and good dielectric properties.

With advantages like non-contact printing, full digital control, high precision, low waste of raw materials, low costs, flexibility, and convenience for mass production, inkjet printing is widely used for patterned deposition in manufacturing electronic products such as liquid crystal displays (LCDs), organic light-emitting diode (OLED) displays, polymer light-emitting diode (PLED) displays, and other display panels.

In the display panel, a liquid for inkjet printing a film layer is sprayed onto the substrate to become spherical cap-shaped droplets, and then spread and, after drying, solidifying to form a uniform printed film layer on a surface of the substrate. In high generation lines (such as G8.5) of LCDs, polyimide (PI) alignment film is usually produced by inkjet printing. There is a certain distance (the distance is about 100 um in both X and Y directions) between the PI droplets produced by the inkjet printing, and the PI droplets needs to be spread, dried, and solidified to form the uniform film layer on the surface of the substrate. In polymer sustained vertical alignment (PSVA) LCD display panels, multi-domain designs (e.g., 8 domains) and high-resolution products require a single pixel area to be smaller. In order to improve a color shift problem, the multi-domain designs are often used, and the 8-domain technology is the most common one. A pixel 20 is divided into two areas, i.e., a main pixel and a sub-pixel which are different in size (e.g., an area ratio: 1:2/2:3). As shown in FIG. 1A, to ensure brightness uniformity at edges, the outermost edges are usually provided with a row of smaller main pixels 10 (<100*100 um). Due to the presence of leads, the pixels are higher in elevation around opening regions. At the same time, the pixels are too small, and the PI droplets have a larger spacing, so it is impossible to ensure that the PI droplets are sprayed into these small pixels (see FIG. 1B). If the PI droplets are not sprayed into the main pixels at the edges, the PI liquid flows to edges of the main pixels. Since there is a frame formed by the leads at a higher elevation around the edges of the pixels, the PI liquid only flows around and cannot enter the pixels due to tension. As a result, no PI liquid is inside the main pixels 10 (as shown in FIG. 1C), causing defects such as bright spots or bright edge lines resulting from poor alignment.

Therefore, the present invention provides a solution. By making smaller pixels communicate with larger pixels or making smaller pixels communicate with each other, the PI liquid in adjacent pixels flows into the pixels which the PI liquid is difficult to enter, so that the PI liquid can flow into these smaller pixels. This configuration improves a problem of poor display quality resulting from poor alignment due to the PI liquid's inability to flow into the smaller pixels during an inkjet printing process. Accordingly, production yields and product quality can be improved.

SUMMARY

In order to solve the above problem, the present invention provides a substrate, comprising:
a glass base plate;
a first base layer disposed on the glass base plate;
a light shielding layer disposed on the first base layer;
a plurality of pixel units disposed on the first base layer, the pixel unit comprising at least one light transmissive region; and
a photomask for exposing the light shielding layer;
wherein the photomask is configured to expose, develop, and etch away a portion of the light shielding layer on the pixel units which need to communicate with each other to form a plurality of grooves in the light shielding layer to communicate with the pixel units.

The present invention is achieved by the following technical solutions.

According to one embodiment of the present invention, the first base layer is a full planar structure.

According to one embodiment of the present invention, a width of the groove of the light shielding layer is greater than or equal to ½ of a length of a corresponding side of the pixel unit.

According to one embodiment of the present invention, a depth of the grooves of the light shielding layer is ½ of a thickness of the light shielding layer.

According to one embodiment of the present invention, the grooves of the light shielding layer are square or circular in shape.

According to one embodiment of the present invention, the photomask is a gray-scale mask or a half-tone mask.

The present invention further provides the following solution to solve the technical problem.

The present invention further provides a manufacturing method of a substrate, comprising:
providing a glass base plate;
forming a first base layer disposed on the glass base plate;
forming a light shielding layer disposed on the first base layer;
forming a plurality of pixel units disposed on the first base layer, wherein the pixel unit comprises at least one light transmissive region; and
providing a photomask for exposing the light shielding layer,
wherein the photomask is configured to expose, develop, and etch away a portion of the light shielding layer on the pixel units which need to communicate with each other to form a plurality of grooves in the light shielding layer to communicate with the pixel units.

According to one embodiment of the present invention, a width of the groove of the light shielding layer is greater than or equal to ½ of a length of a corresponding side of the pixel unit.

According to one embodiment of the present invention, a depth of the grooves of the light shielding layer is ½ of a thickness of the light shielding layer.

According to one embodiment of the present invention, the grooves of the light shielding layer are square or circular in shape.

In the present invention, smaller pixels communicate with larger pixels or with each other, so the PI liquid in adjacent pixels can flow into the pixels which the PI liquid is difficult to enter, and consequently, the PI liquid can flow into the smaller pixels. This configuration improves a problem of poor display quality resulting from poor alignment due to the PI liquid's inability to flow into openings/holes/pixels during an inkjet printing process. Accordingly, production yields and product quality can be improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

Figure 1A:
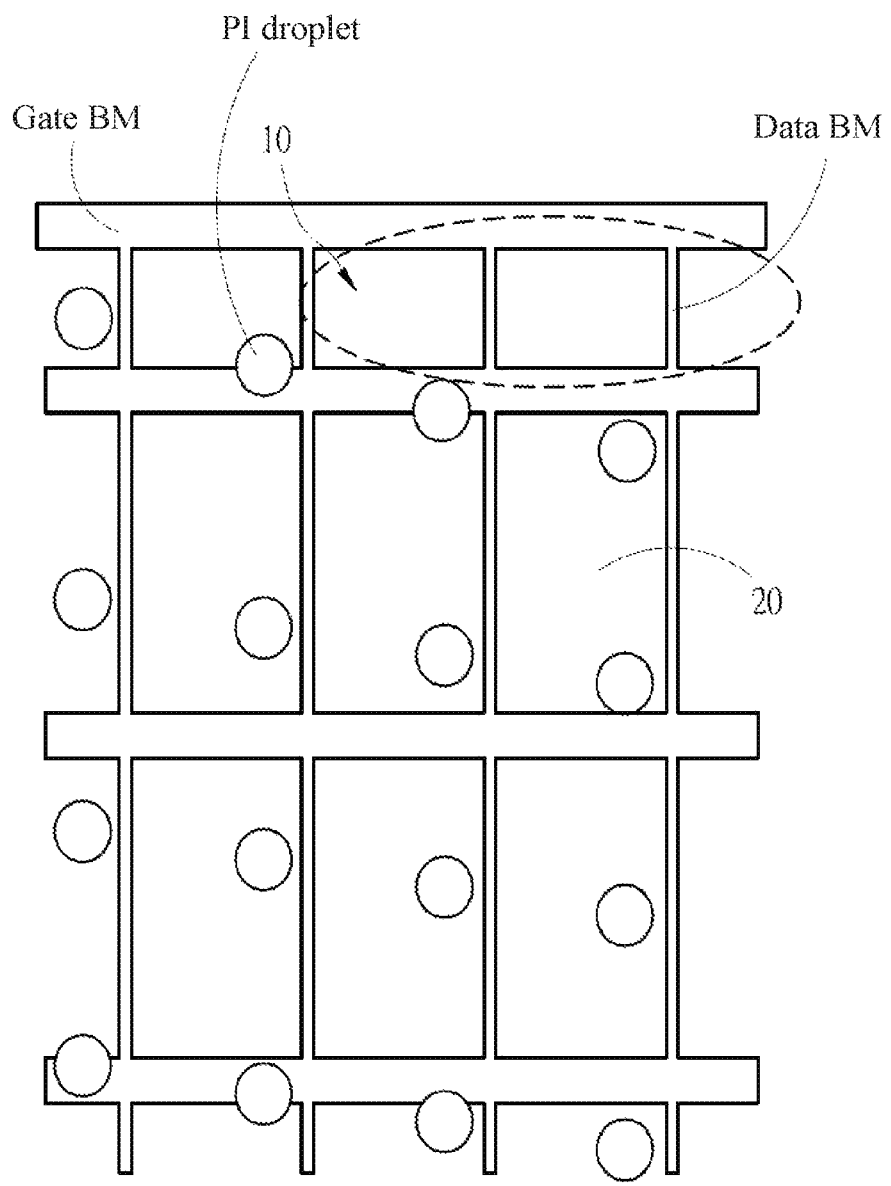
FIG. 1A is a schematic view illustrating a layout of a conventional substrate.
Figure 1B:
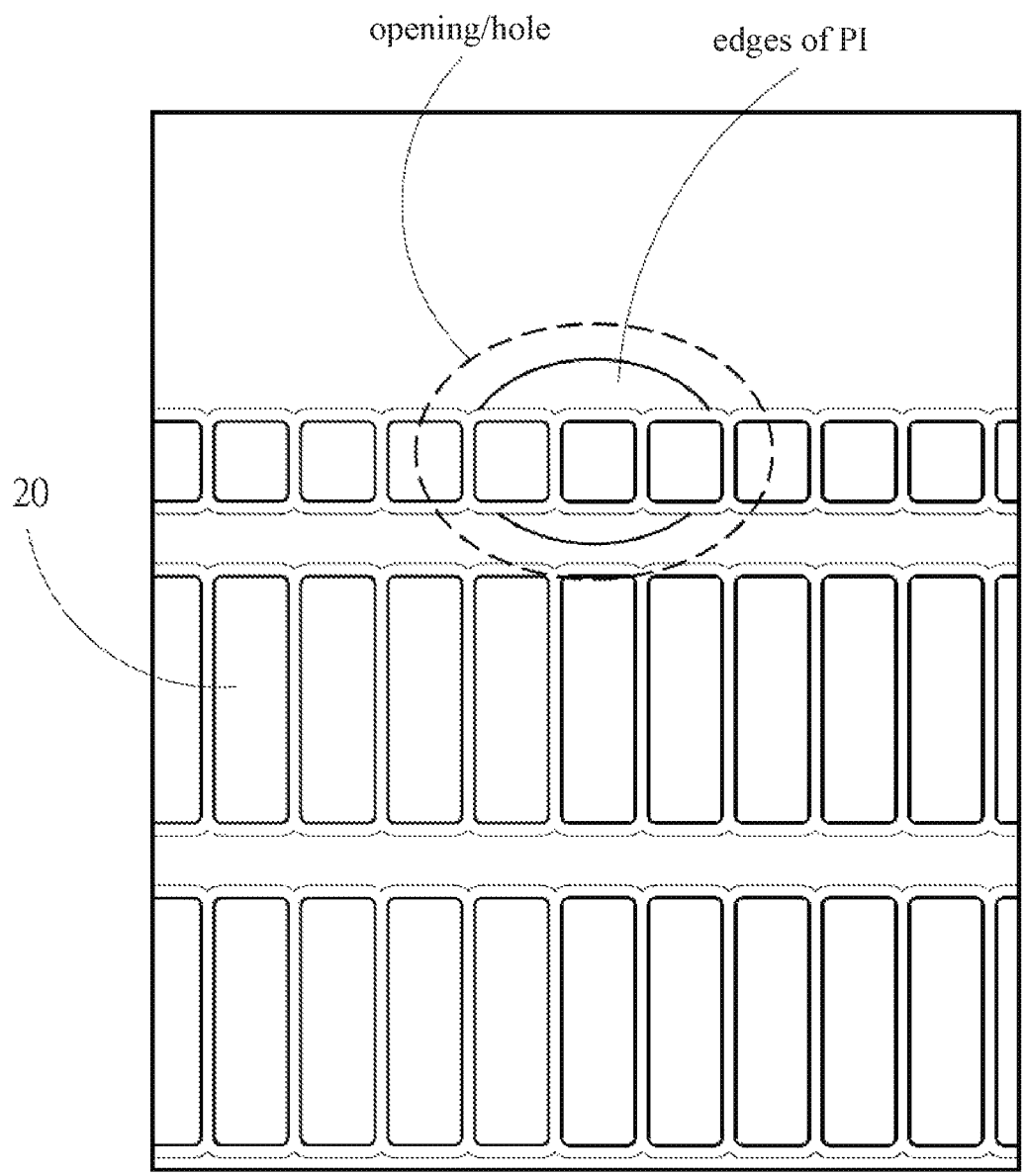
FIG. 1B is a schematic view illustrating arrangement of pixels at an edge of the conventional substrate.
Figure 1C:
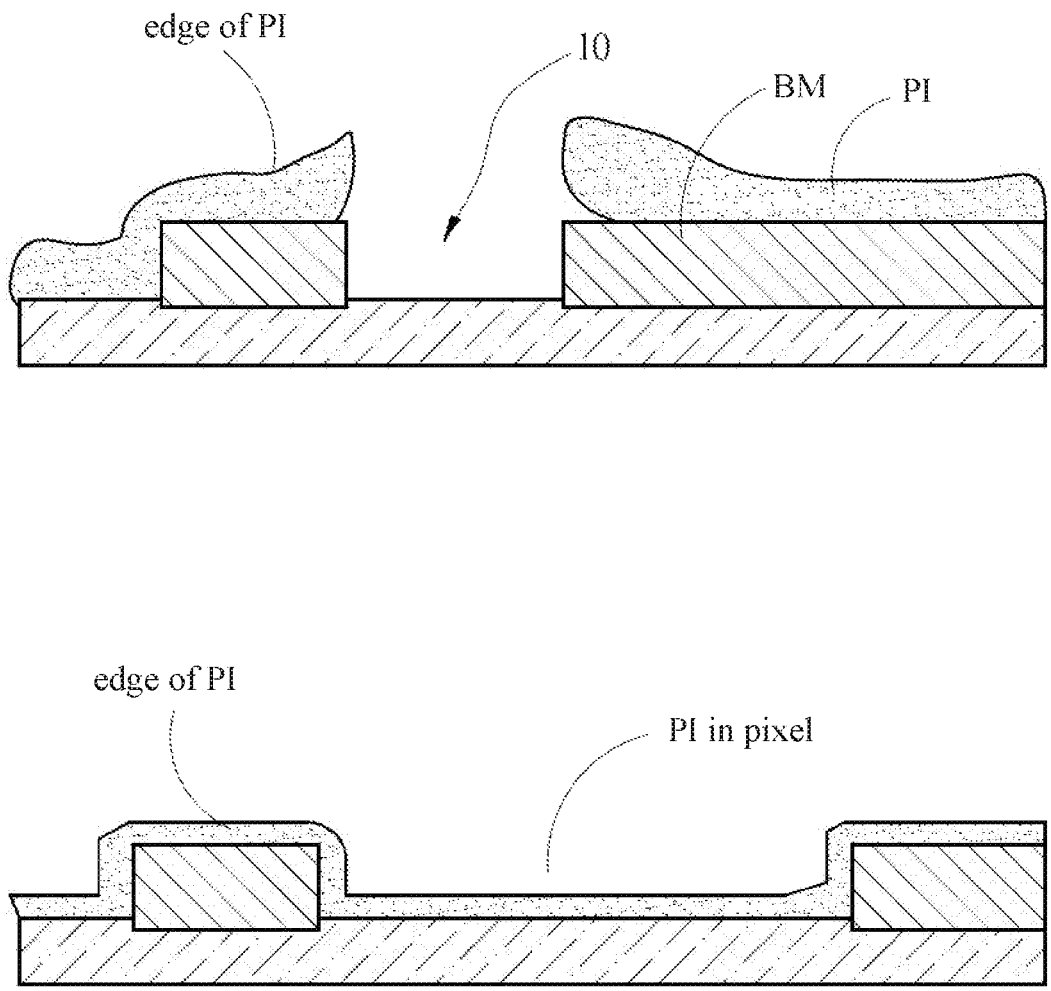
FIG. 1C is a schematic cross-sectional view illustrating a polyimide (PI) layer coating applied to different pixels in the conventional substrate.

Please refer to the accompanying drawings, in which the same reference numerals denote the same components. The following description is provided for illustrating some specific embodiments of the present invention, and should not be construed as limiting or precluding the inclusion of other embodiments within the scope of the present invention.

The following description is provided for illustrative purposes with reference to specific embodiments of the present invention. Directional terms mentioned in the present disclosure, such as "upper", "lower", "front", "rear", "left", "right", "inside", "outside", and "lateral", are for ease of illustration of the present invention and the accompanying drawings. Therefore, the directional terms are not intended to be limiting.

In the accompanying drawings, thicknesses of layers, films, panels, regions, and etc. are exaggerated for clarity. In the accompanying drawings, thicknesses of some layers and regions are exaggerated for ease of illustration and understanding. It should be noted that when a component such as a layer, a film, a region, or a substrate is described as being "on" another component, the component can be directly on the another component or there is an intermediate component between them.

The accompanying drawings and description are to be illustrative rather than restrictive. In the drawings, structurally similar elements are denoted by the same reference numerals. In addition, the size and thickness of each component shown in the drawings are merely illustrative for ease of understanding and illustration, and the present application is not limited in this regard.

In addition, in the present disclosure, the word "comprising" indicates inclusion of the component mentioned, but does not preclude the inclusion of other components. Further, in the present disclosure, "on" means "above or below the component", and does not mean that it must be on the top in the direction of gravity.

In order to further explain the technical solutions and functions of the present invention for achieving the intended purpose of the present invention, the following description is provided to illustrate a substrate and a manufacturing method thereof according to the present invention with reference to the accompanying drawings and specific embodiments. The embodiments and related structures, features, and functions are detailed below.

Figure 2:
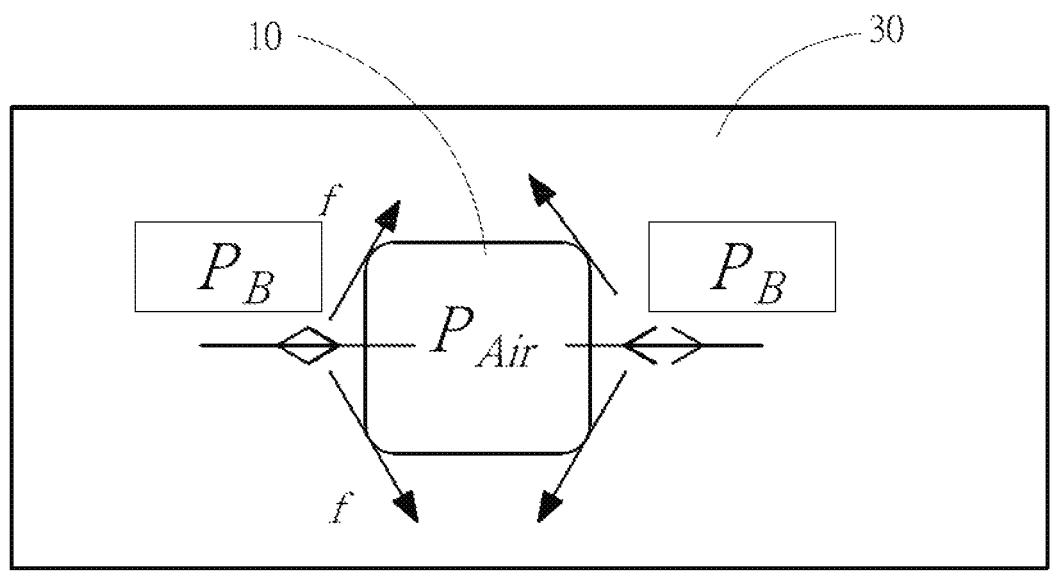
FIG. 2 is schematic view illustrating stress states of a PI liquid around the pixels of the conventional substrate.

FIG. 2 is schematic view illustrating stress states of a polyimide (PI) liquid 30 around pixels of a conventional substrate. Referring to FIG. 2, when the PI liquid 30 flows to around the main pixel 10, the stress states of the PI liquid 30 are as follows. At a concave liquid surface, surface tension f of the PI liquid 30 is in tangential directions with respect to the main pixel 10, so the PI liquid 30 easily flows around edges of the pixels. A pressure $P_B$ is generated by the surface tension f of the PI liquid 30, and the concave liquid surface is subjected to an air pressure $P_{Air}$. According to Young-Laplace equation, it can be known that, $P_{Air} > P_B$, and a pressure stresses the liquid is $P_S = P_B - P_{Air} < 0$. In other words, the pressure from the air is larger, and it is difficult for the PI liquid 30 to flow into a hole. The pixel is square in shape, and the larger a size is (less than a distance between PI droplets), the less the pressure $P_B$ is generated by the surface tension f, and it is more difficult for the PI liquid 30 to flow into the main pixel 10.

Figure 3A:
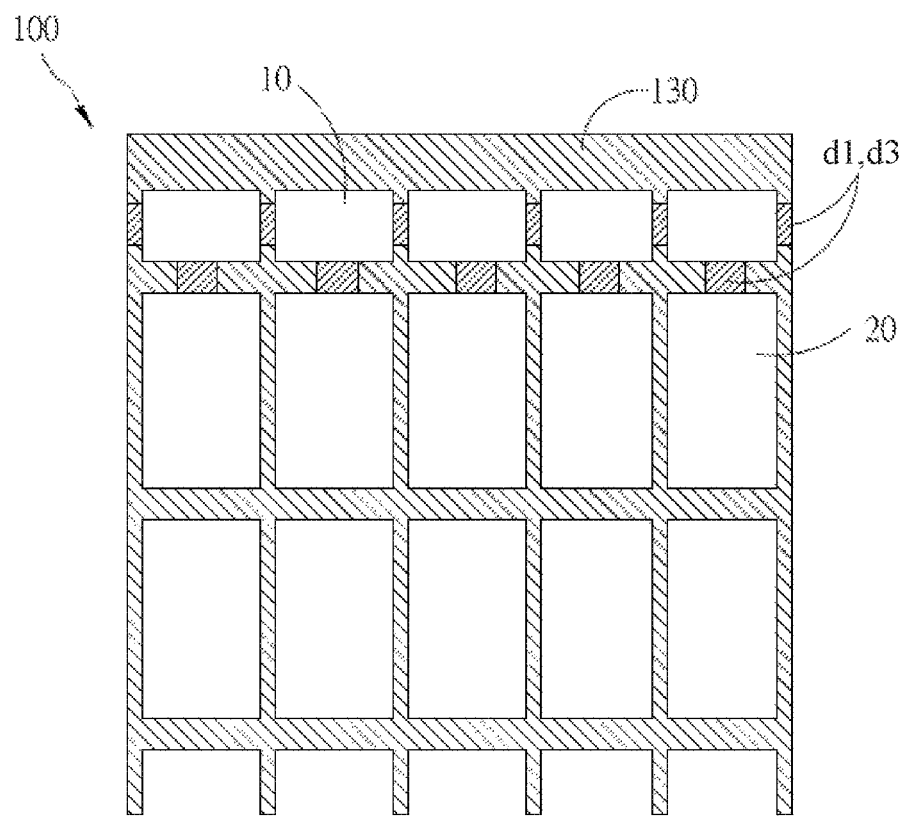
FIG. 3A is a schematic view illustrating a layout of a substrate according to one embodiment of the present invention.
Figure 3B:
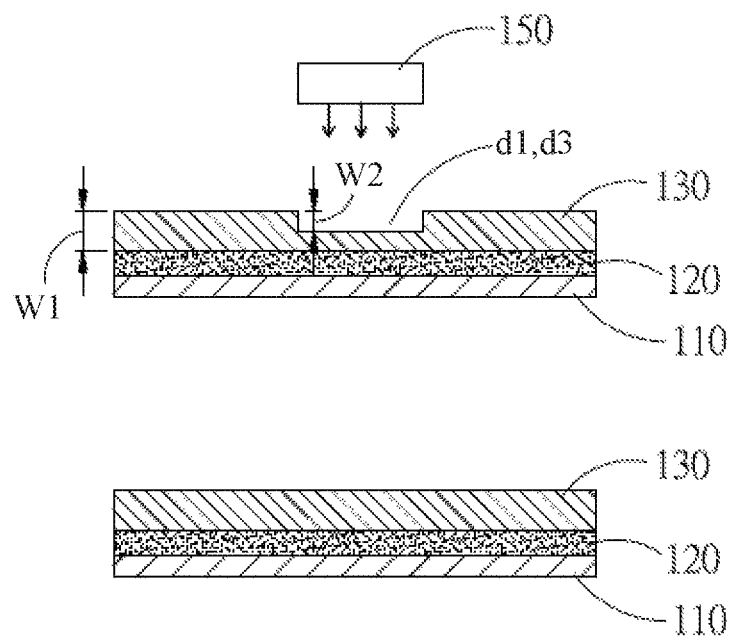
FIG. 3B is a schematic cross-sectional view illustrating a light shielding layer for different pixels on the substrate according to one embodiment of the present invention.
Figure 4:
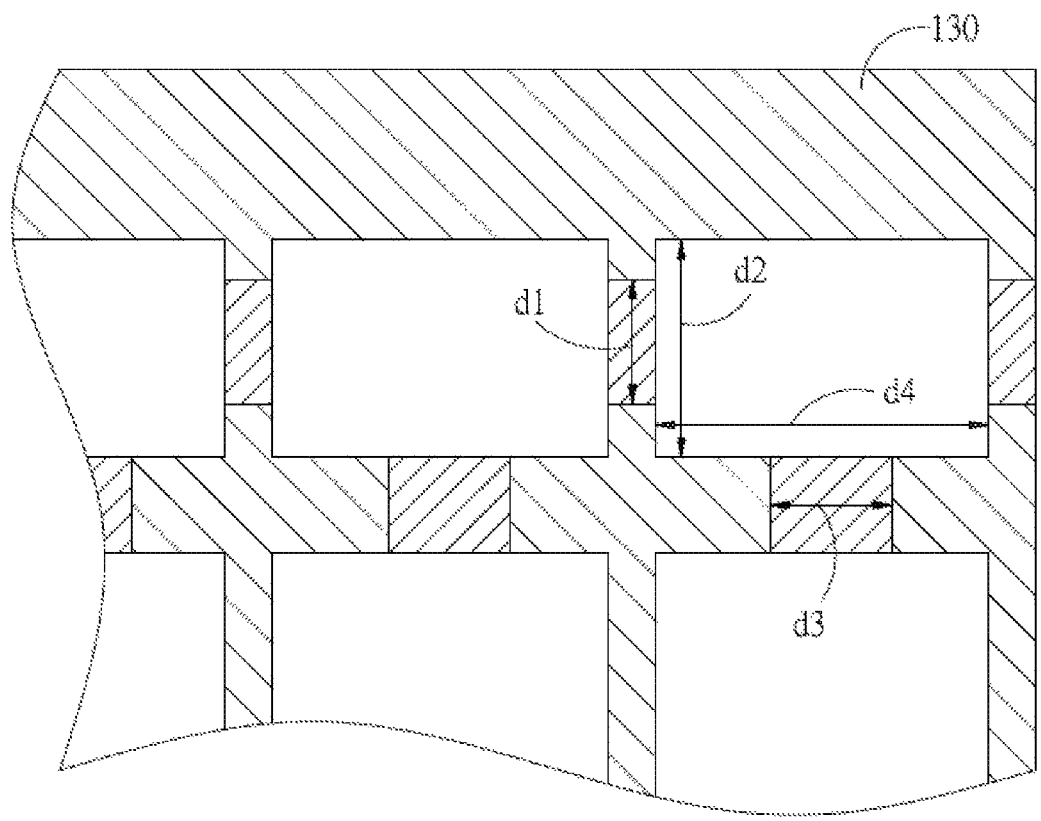
FIG. 4 is a schematic view illustrating widths of grooves of the light shielding layer on the substrate according to one embodiment of the present invention.

FIG. 3A is a schematic view illustrating a layout of a substrate according to one embodiment of the present invention. FIG. 3B is a schematic cross-sectional view illustrating a light shielding layer for different pixels on the substrate according to one embodiment of the present invention. FIG. 4 is a schematic view illustrating widths of grooves of the light shielding layer on the substrate according to one embodiment of the present invention.

Please refer to FIGS. 3A, 3B, and 4. According to one embodiment of the present invention, a substrate 100 is provided, comprising:

a glass base plate 110;

a first base layer 120 disposed on the glass base plate 110;

a light shielding layer 130 disposed on the first base layer 120;

a plurality of pixel units 10, 20 disposed on the first base layer 120, the pixel unit 10, 20 comprising at least one light transmissive region; and a photomask 150 for exposing the light shielding layer, wherein the photomask 150 is configured to expose, develop, and etch away a portion of the light shielding layer 130 on the pixel units 10, 20 which need to communicate with each other, so that a plurality of grooves are defined in the light shielding layer 130 to communicate with the pixel units 10, 20.

According to one embodiment of the present invention, the first base layer 120 is a full planar structure.

According to one embodiment of the present invention, a width d1, d3 of the groove of the light shielding layer 130 is greater than or equal to ½ of a length d2, d4 of a corresponding side of the pixel unit.

According to one embodiment of the present invention, a depth W2 of the grooves of the light shielding layer 130 is ½ of a thickness W1 of the light shielding layer 130.

According to one embodiment of the present invention, the grooves of the light shielding layer 130 are square or circular in shape; however, the shape is not limited to square or circular shapes, but includes all suitable shapes.

According to one embodiment of the present invention, the photomask 150 is a gray-scale mask or a half-tone mask.

Multi-tone photomasks can be classified into two types: gray-tone masks and half-tone masks. The gray-tone masks achieve semi-exposure by shielding part of the light with slit patterns that are finer than the resolution provided by exposure equipment. On the other hand, the half-tone masks use a "semitransparent" film to realize semi-exposure. Either type can create three levels of exposure on substrates in one round of exposure: fully exposed, semi-exposed, and non-exposed areas. By selecting one of the multi-tone photomasks, the photoresist can be left on the substrates in two thicknesses. Using the difference between these thicknesses, a smaller number of multi-tone photomasks can transfer patterns to the substrates and thus increase production efficiency of display panels.

Figure 5:
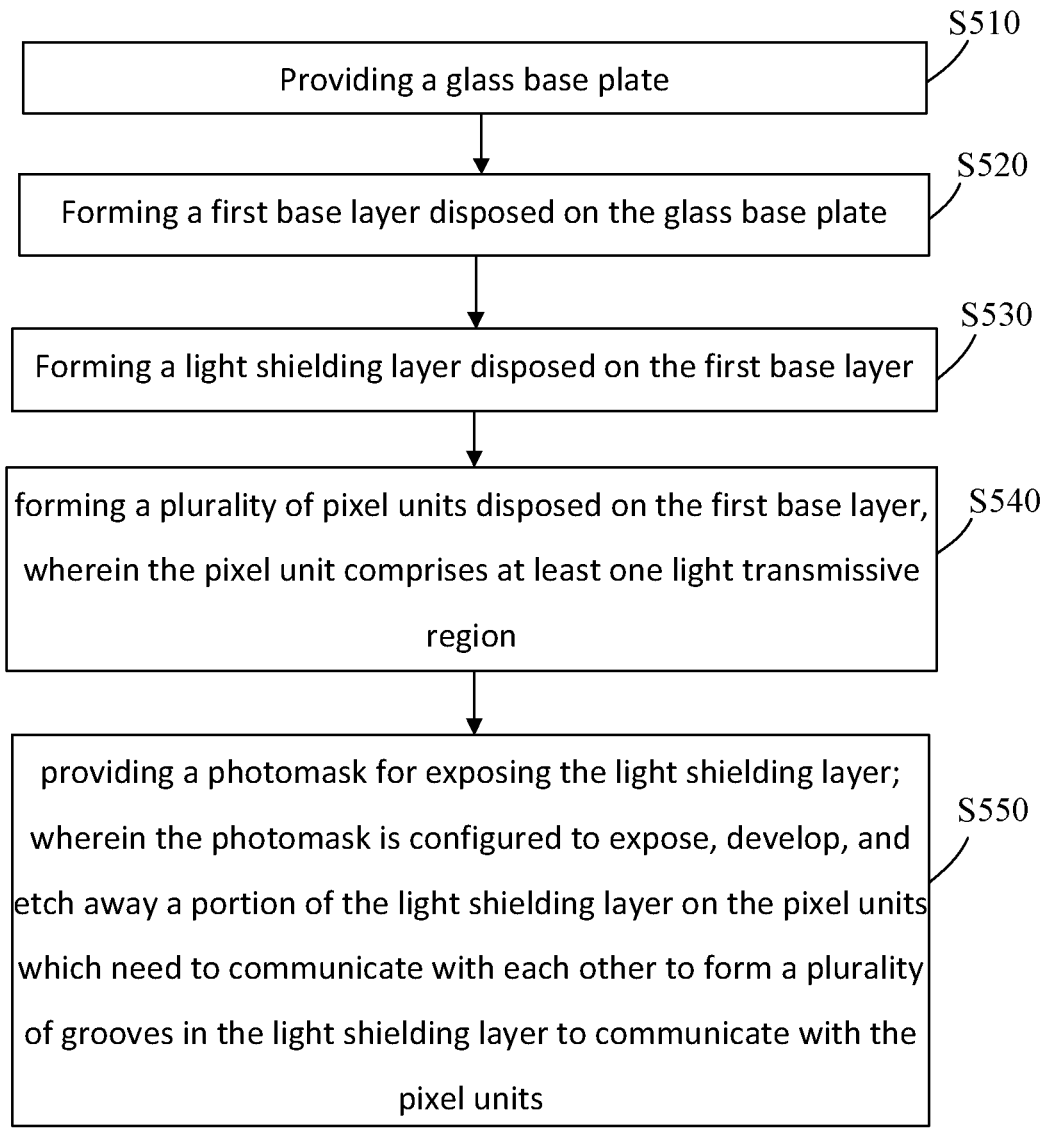
FIG. 5 is a process flow diagram illustrating a manufacturing method of the substrate according to one embodiment of the present invention.

FIG. 5 is a process flow diagram illustrating a manufacturing method of the substrate according to one embodiment of the present invention. Please refer to FIGS. 3A, 3B, 4, and 5. According to one embodiment of the present invention, a manufacturing method of a substrate is provided, comprising:

providing a glass base plate 110;

forming a first base layer 120 disposed on the glass base plate 110;

forming a light shielding layer 130 disposed on the first base layer 120;

forming a plurality of pixel units 10, 20 disposed on the first base layer 120, wherein the pixel unit 10, 20 comprises at least one light transmissive region; and providing a photomask 150 for exposing the light shielding layer 130;

wherein the photomask 150 is configured to expose, develop, and etch away a portion of the light shielding layer 130 on the pixel units 10, 20 which need to communicate with each other, so that a plurality of grooves are defined in the light shielding layer 130 to communicate with the pixel units 10, 20.

Please refer to FIGS. 3A, 3B, 4, and 5. In the manufacturing method according to one embodiment of the present invention, a width d1, d3 of the groove of the light shielding layer 130 is greater than or equal to ½ of a length d2, d4 of a corresponding side of the pixel unit 10, 20.

Please refer to FIGS. 3A, 3B, and 5. In the manufacturing method according to one embodiment of the present invention, a depth W2 of the grooves of the light shielding layer 130 is ½ of a thickness W1 of the light shielding layer 130.

Please refer to FIGS. 3A, 3B, and 5. In the manufacturing method according to one embodiment of the present invention, the grooves of the light shielding layer are square or circular in shape; however, the shape is not limited to square or circular shapes, but includes all suitable shapes.

As shown in FIG. 5, step S510: providing a glass base plate.

As shown in FIG. 5, step S520: forming a first base layer disposed on the glass base plate.

As shown in FIG. 5, step S530: forming a light shielding layer disposed on the first base layer.

As shown in FIG. 5, step S540: forming a plurality of pixel units disposed on the first base layer, wherein the pixel unit comprises at least one light transmissive region.

As shown in FIG. 5, step S550: providing a photomask for exposing the light shielding layer; wherein the photomask is configured to expose, develop, and etch away a portion of the light shielding layer on the pixel units which need to communicate with each other, so that a plurality of grooves are defined in the light shielding layer to communicate with the pixel units.

In the present invention, smaller pixels communicate with larger pixels or with each other, so the PI liquid in adjacent pixels can flow into the pixels which the PI liquid is difficult to enter, and consequently, the PI liquid can flow into the smaller pixels. This configuration improves a problem of poor display quality resulting from poor alignment due to the PI liquid's inability to flow into openings/holes/pixels during an inkjet printing process. Accordingly, production yields and product quality can be improved.

It should be noted that various changes and modifications can be made by persons of ordinary skills in accordance with the technical solutions and technical concept of the present invention, and all such changes and modifications should be deemed to be within the protection scope of the appended claims.

INDUSTRIAL APPLICABILITY

The present invention can be manufactured and used in the industry with industrial applicability.

What is claimed is:

1. A substrate, comprising:
a glass base plate;
a first base layer disposed on the glass base plate;
a light shielding layer disposed on the first base layer;
a plurality of pixel units disposed on the first base layer, the pixel units comprising at least one light transmissive region; and
a photomask for exposing the light shielding layer,
wherein the photomask is configured to expose, develop, and etch away a portion of the light shielding layer on the pixel units which need to communicate with each other to form a plurality of grooves in the light shielding layer to communicate with the pixel units.

2. The substrate according to claim 1, wherein the first base layer is a full planar structure.

3. The substrate according to claim 1, wherein a width of the plurality of the grooves of the light shielding layer is greater than or equal to ½ of a length of a corresponding side of the pixel units.

4. The substrate according to claim 1, wherein a depth of the grooves of the light shielding layer is ½ of a thickness of the light shielding layer.

5. The substrate according to claim 1, wherein the grooves of the light shielding layer are square or circular in shape.

6. The substrate according to claim 1, wherein the photomask is a gray-scale mask or a half-tone mask.

7. A manufacturing method of a substrate, comprising:
providing a glass base plate;

forming a first base layer disposed on the glass base plate;

forming a light shielding layer disposed on the first base layer;

forming a plurality of pixel units disposed on the first base layer, wherein the pixel units comprise at least one light transmissive region; and providing a photomask for exposing the light shielding layer;

wherein the photomask is configured to expose, develop, and etch away a portion of the light shielding layer on the pixel units which need to communicate with each other to form a plurality of grooves in the light shielding layer to communicate with the pixel units.

8. The manufacturing method of the substrate according to claim 7, wherein a width of the grooves of the light shielding layer is greater than or equal to ½ of a length of a corresponding side of the pixel units.

9. The manufacturing method of the substrate according to claim 7, wherein a depth of the grooves of the light shielding layer is ½ of a thickness of the light shielding layer.

10. The manufacturing method of the substrate according to claim 7, wherein the grooves of the light shielding layer are square or circular in shape.

* * * * *